United States Patent
Young (10) Patent No.: US 7,101,740 B2
(45) Date of Patent: Sep. 5, 2006

(54) ELECTRONIC DEVICES COMPRISING BOTTOM-GATE TFTS AND THEIR MANUFACTURE

(75) Inventor: Nigel D. Young, Redhill (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 81 days.

(21) Appl. No.: 10/513,099

(22) PCT Filed: Apr. 25, 2003

(86) PCT No.: PCT/IB03/01733

§ 371 (c)(1),
(2), (4) Date: Oct. 29, 2004

(87) PCT Pub. No.: WO03/094244

PCT Pub. Date: Nov. 13, 2003

(65) Prior Publication Data

US 2005/0176226 A1 Aug. 11, 2005

(30) Foreign Application Priority Data

May 2, 2002 (GB) .................................. 0210065.9

(51) Int. Cl.
*H01L 21/70* (2006.01)
(52) U.S. Cl. ........................ 438/158; 438/166; 438/151; 257/72; 349/46
(58) Field of Classification Search .............. 438/166, 438/158, 151, 30, 128; 257/66, 72; 349/46
See application file for complete search history.

(56) References Cited

U.S. PATENT DOCUMENTS

| | | | | |
|---|---|---|---|---|
| 5,153,690 A | * | 10/1992 | Tsukada et al. ............... | 257/61 |
| 5,266,507 A | * | 11/1993 | Wu ............................ | 438/154 |
| 5,461,250 A | * | 10/1995 | Burghartz et al. .......... | 257/347 |
| 5,612,235 A | * | 3/1997 | Wu et al. .................... | 438/158 |
| 5,793,072 A | * | 8/1998 | Kuo ........................... | 257/241 |
| 5,818,070 A | * | 10/1998 | Yamazaki et al. ............ | 257/72 |
| 5,821,563 A | * | 10/1998 | Yamazaki et al. ............ | 257/66 |
| 6,235,563 B1 | | 5/2001 | Hideaki et al. | |
| 6,338,988 B1 | * | 1/2002 | Andry et al. ............... | 438/158 |
| 6,504,215 B1 | * | 1/2003 | Yamanaka et al. .......... | 257/350 |
| 6,605,496 B1 | * | 8/2003 | Yamazaki .................... | 438/166 |
| 2001/0005020 A1 | * | 6/2001 | Jinno et al. .................. | 257/59 |
| 2001/0011726 A1 | * | 8/2001 | Hayashi et al. ............... | 257/59 |
| 2001/0030323 A1 | * | 10/2001 | Ikeda ........................... | 257/59 |
| 2001/0049163 A1 | * | 12/2001 | Yamazaki et al. .......... | 438/158 |

OTHER PUBLICATIONS

S. Kang et al., "CMOS Digital Integrated Circuits," 2003, Third Edition, pp. 116-117.*
Patent Abstracts of Japan vol. 015, No. 304 (E-1096) Aug. 5, 1991.

* cited by examiner

Primary Examiner—Bradley K. Smith
Assistant Examiner—Steven J. Fulk
(74) Attorney, Agent, or Firm—Kevin Fortin (57) ABSTRACT

A method of manufacturing an electronic device comprising a bottom-gate TFT (12) is provided, the method comprising the steps of: forming a doped amorphous silicon gate layer (26') on a substrate, the gate layer defining a gate (26), forming a gate insulating layer (32) over the gate, forming an amorphous silicon active layer (28') over the gate insulating layer and overlying at least part of the gate, and annealing the amorphous silicon active layer to form a polysilicon active layer (28). A thinner gate insulating layer can be used giving a TFT having a low threshold voltage.

15 Claims, 5 Drawing Sheets

FIG.7

ELECTRONIC DEVICES COMPRISING BOTTOM-GATE TFTS AND THEIR MANUFACTURE

This invention relates to electronic devices comprising thin-film transistors (hereinafter termed "TFTs") and, in particular, polycrystalline silicon (hereinafter termed polysilicon) bottom-gate TFTs each having a gate, a gate insulating layer and a polysilicon active layer overlying the gate. The device may be, for example, an active matrix display device, a sensing array or a thin-film data storage device. The invention also relates to methods of manufacturing such an electronic device comprising a bottom-gate TFT.

There is increasing interest in developing polysilicon TFTs for large area electronics applications such as the addressing circuitry in active matrix flat panel displays as described in U.S. Pat. No. 5,130,829 to which reference is invited. In general, polysilicon TFTs offer a faster addressing speed than TFTs fabricated with amorphous silicon active layers. Polysilicon active layers are conventionally formed by an annealing process in which an amorphous silicon layer is melted, by laser for example, and allowed to cool reforming into a poly-crystalline structure. In the case of an array of TFTs, the active layer may be patterned into individual active islands for each TFT either before or after the annealing process. A more detailed description of polycrystallisation of silicon by laser annealing is given in the paper by S. D. Brotherton et al, "Influence of melt depth in laser crystallized poly-Si thin film transistors", J. Appl. Phys, 82 (8), pages 4086 to 4094, (1997), to which reference is invited.

For the purposes of this description, the term "amorphous" relates to materials in which the constituent atoms are randomly positioned. The term "polycrystalline" relates to materials which comprise a plurality of monocrystals, a monocrystal having a regular repeating lattice structure of its constituent atoms. This is particularly relevant to polycrystalline silicon, or polysilicon, which is commonly formed by melting and cooling amorphous silicon. Typical grain sizes for polysilicon lie between 0.1 µm and 5 µm. However, when crystallised under certain conditions, the silicon can have a grain size on a microscopic scale, typically 0–0.5 µm. The term "microcrystalline" relates to crystalline materials having grain sizes on a microscopic scale.

There is particular interest in fabricating TFTs having low threshold voltages. Circuits comprising such devices can operate at lower voltages and, due to their small size, can operate at a greater speed. Low threshold voltages can be achieved by reducing the thickness of the gate insulating layers, or dielectrics, formed between the gate of a TFT and the polysilicon active layer. However, as the gate insulating layers become thinner, the greater the requirement for a smooth interface between the surfaces of the gate insulating layer and its adjacent layers.

The annealing process required to polycrystallise the amorphous silicon layers severely roughens the top surface thereof. This is described in more detail in the paper by McCulloch et al, Appl Phys Lett, 66, 16, pages 2060 to 2062, (1995), to which reference is invited.

In top-gated TFT devices, in which the gate overlies the active layer, the roughened top surface of the active layer is adjacent the gate insulating layer. This limits the use of thin gate insulating layers because deformities at the interface cause weak spots at which electrical breakdown may occur.

It may be thought that bottom-gated TFT devices, in which the active layer overlies the gate and the roughened (top) surface of the active layer is remote from the gate insulating layer would be more suited than top-gated devices to using a thinner gate insulating layer. However, the roughness of the surface of the underlying gate can also be a limiting factor. Gates formed from metal, such as aluminium for example, are known to deform or melt when subjected to the heat conducted via the upper layers during the annealing process. During this process, the active layer, formed initially as amorphous silicon, is subjected to an energy beam which melts the silicon through the whole thickness of the layer. The integrity of the gate material must survive this annealing process. However, due to the low melting point of some conventionally used metals, the gate can be caused to melt or evaporate. This can lead to hillock formation causing "spiking" in which the top surface of the metal gate becomes roughened to the extent that it penetrates through the gate insulating layer causing electrical breakdown of the TFT. Also, the difference in mechanical properties between the layers in the device stack can cause the gate to delaminate through heating, mechanical stress or adhesion failure.

U.S. Pat. No. 6,025,218, the contents of which is included herein as reference material, describes a method of manufacturing a TFT device having a laminated bottom-gate electrode comprising a metal film and a less conductive film. In an embodiment described in U.S. Pat. No. 6,025,218 the gate comprises a laminated conductor having a metal film and a semiconductor film which may comprise amorphous silicon. An insulating film covers at least part of the laminated conductor and extends below a semiconductor island. The semiconductor film is said to provide protection for the metal film of the laminated conductor from an energy beam during the crystallisation of the semiconductor material of the island. However, on a microscopic scale, thin film metals have rough surfaces which result from the formation of many separate crystallites during the deposition, giving the metal film a polycrystalline nature. The vertical scale of the roughness of metal films can be 10–25% of the film thickness. Additionally, thin metal films can be pin-holed. More importantly, the changes in surface from one grain to another can be quite angular (large values of curvature=$d^2y/dx^2$, where y is the vertical parameter and x is the lateral parameter in a 2-D model). This can cause coverage problems giving rise to local high field points which may result in electrical breakdown across a thin overlying gate insulating layer even if protected by a semiconductor layer as in U.S. Pat. No. 6,025,218.

It is an object of the present invention to provide an improved method of manufacturing an electronic device comprising a bottom gate polysilicon TFT which at least partially alleviates the aforementioned problems associated with using thinner gate insulating layers.

According to one aspect of the present invention there is provided a method of manufacturing an electronic device comprising a bottom-gate TFT, the method comprising the steps of:

forming a doped amorphous silicon gate layer on a substrate, the gate layer defining a gate;
forming a gate insulating layer over the gate;
forming an amorphous silicon active layer over the gate insulating layer and overlying at least part of the gate; and,
annealing the amorphous silicon active layer to form a polysilicon active layer.

This results in an improved bottom-gate TFT having a low threshold voltage. By using doped amorphous silicon for the gate layer, smooth film can be deposited directly onto the substrate allowing a smooth interface with the overlying gate insulating layer, as desirable for TFTs having low threshold voltages. Doped amorphous silicon has a higher melting point than most metals used conventionally for gates. Therefore, the risk of hillock formation leading to spiking is reduced as the gate material is less likely to deform during the annealing process even if this layer gets heated. The mechanical properties of the gate material are similar to those of the other layers in the device stack. Advantageously this reduces the risk of delamination of the gate when heated.

The annealing of the amorphous silicon active layer may cause at least an upper surface region of the gate layer to become microcrystalline through solid phase crystallisation as a result of heating of the gate layer material during the annealing process. The surface of the microcrystalline layer remains smooth. Advantageously, this can increase the conductivity of the gate layer material.

The doped amorphous silicon gate layer need not be completely covered by the amorphous silicon active layer, and a portion may be left exposed to the energy beam. The exposed portion of the gate layer may then become polycrystalline through the annealing process. Advantageously, this may be used to reduce the resistance of, for example, connections to the gate which can reduce the charging time of the gate.

Preferably, the edges of the gate are tapered such that they slope outwardly towards the substrate. This avoids step coverage problems and ensures good coverage of the gate by the gate insulating layer, and is particularly important when using a relatively thin gate insulating layer. Preferably, the angle made between at least one of the tapered edges of the gate and the substrate is between 10° and 30°. Dry etching may, for example, be used to form the tapered edges.

The gate insulating layer may comprise silicon oxide, silicon nitride, tantalum oxide, aluminium oxide, titanium oxide, hafnium oxide, zirconium oxide, an alloy of any of these materials, or any other suitable material with a high dielectric constant.

In a preferred embodiment, the thickness of the doped amorphous silicon gate layer is between 5 nm and 10 nm, the thickness of the gate insulating layer is between 1 nm and 40 nm, and the thickness of the amorphous silicon active layer is between 10 nm and 100 nm. Advantageously, the gate insulating layer is made as thin as is practicably possible for an operational TFT and has a thickness in the range of 1 nm to 5 nm. This gives TFTs with low threshold values which is particularly beneficial when used in arrays for low-power active matrix devices. Also, the size of the TFTs can be scaled down to allow higher resolution active matrix devices to be fabricated.

The method may further comprise the step of forming a top-gate overlying at least part of the polysilicon active layer, (the top-gate for example contacting with the bottom-gate via a contact hole). This produces a dual-gate TFT which offers an even lower threshold voltage than the corresponding single-gate TFT, together with a higher on-current and lower off-current.

The electronic device may comprise an active plate for an active matrix device, such as a liquid crystal display, electroluminescent display, sensor array or data storage device. The active plate may comprise an array of TFTs arranged in rows and columns. For such purposes, the method may further comprise the step of forming a set of row conductors, each row conductor contacting with a plurality of gates in the same row. These may be formed before the gate layer so that they lie between the gate layer and the substrate. Alternatively, the row conductors may be formed over the TFT and contact their respective gates via contact holes.

Each row conductor in the active plate may function as an address conductor for supplying address signals to the gates of the TFTs in the corresponding row. The row conductors may serve independently or additionally to back up row conductors formed from the doped amorphous silicon gate layer.

According to another aspect of the present invention, there is provided an electronic device comprising a bottom-gate TFT which comprises a gate of doped amorphous silicon on a substrate, a gate insulating layer over said gate and a polysilicon active layer over said gate insulating layer, said polysilicon active layer comprising an annealed amorphous silicon layer.

Examples of the invention will now be described in detail with reference to the accompanying drawings, in which.

It should be noted that these figures are merely schematic and not drawn to scale. Relative dimensions and proportions of parts of these figures have been shown exaggerated or reduced in size, for the sake of clarity and convenience in the drawings. The same reference numbers are used throughout the drawings to denote the same or similar parts.

Figure 1:
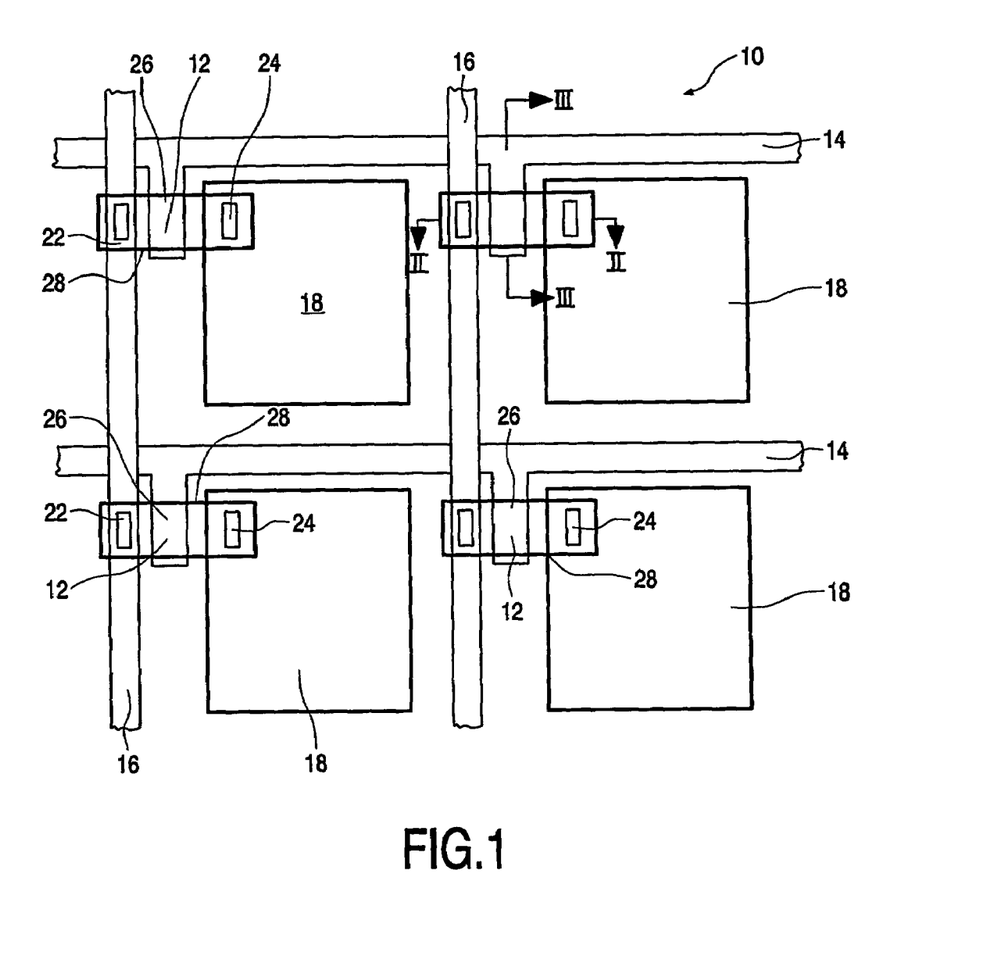
FIG. 1 is a schematic plan view of part of an embodiment of an active plate for an active matrix device manufactured by a method in accordance with the present invention.

The active plate 10 shown in part in FIG. 1 comprises an array of TFTs 12 arranged in rows and columns, each TFT located at the intersection of crossing sets of row and column conductors 14 and 16. Only four TFTs 12 are shown for simplicity but the active plate 10 may comprise several hundreds of rows and columns. The active plate may form part of an active matrix device such as an active matrix display device, for example, having a corresponding array of display pixels, each display pixel associated with a TFT of the active plate 10. By way of example, the active plate 10 shown in FIG. 1 forms part of an AMLCD having an array of LC cells and in which a layer of LC material is sandwiched between the active plate 10 and a passive plate (not shown) carrying a common electrode. Each cell has an associated pixel electrode 18 carried on the active plate 10 and connected to a respective TFT 12. Thus, the voltage applied across each LC cell, i.e. between each pixel electrode 18 and the common electrode, can be controlled by its associated TFT 12. The general operation of this circuitry and the manner in which the display pixels are driven follows conventional practice, as is described for example in U.S. Pat. No. 5,130,829 to which reference is invited for further information in these respects.

The TFTs 12 are FETs and each TFT has a source region 22 connected to the associated column conductor 16, a drain region 24 connected to the associated pixel electrode 18, a gate 26 connected to the associated row conductor 14, and a polysilicon active layer 28 providing a channel which extends between the source and drain regions and which overlies the gate 26.

FIG. 1 is drawn extremely diagrammatically in such a way as to illustrate two alternative embodiments of the present invention.

FIGS. 2A to 2D show cross-sections on the line II—II of FIG. 1, at various stages of fabrication, of a first embodiment of a device manufactured by a method in accordance with the present invention. FIG. 3 shows a cross-section on the line III—III of the same device. The circuitry is formed using conventional thin film processing techniques involving the deposition and photolithographic patterning of various insulating, conductive and semiconductive layers deposited on a substrate 30, e.g. by a CVD process. The TFTs in the array are formed simultaneously using common deposited layers.

Referring firstly to FIG. 3, a set of metal row conductors 14 is formed on a substrate 30 by depositing and patterning a metal layer of, say, aluminium. The substrate 30 here is of glass, although other insulating materials such as polymer, paper or quartz can be used. Non-insulating materials such as metal or silicon could also be used provided that at least their upper surface is made insulating.

Figure 2A:
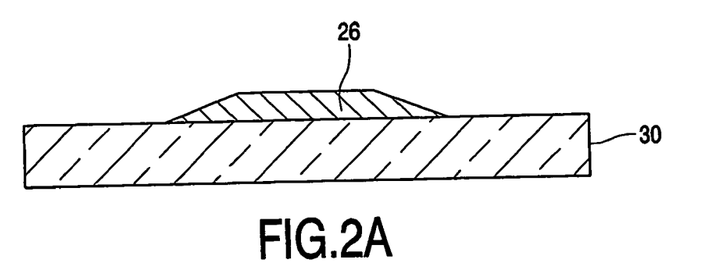
FIGS. 2A–2D show cross-sections on the line II—II of FIG. 1, at various stages of fabrication, of a first embodiment of a device manufactured by a method in accordance with the present invention.
Figure 3:
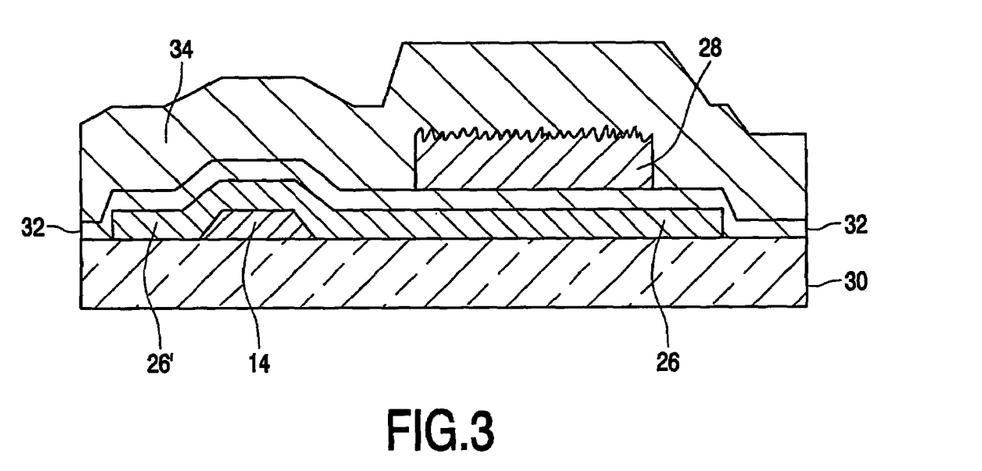
FIG. 3 shows a cross-section on the line III—III of FIG. 1 of the first embodiment of a device manufactured by a method in accordance with the present invention.

Referring now to FIG. 2A and FIG. 3, a doped amorphous silicon gate layer 26' is formed on the substrate, the gate layer having a smooth upper surface and defining a gate 26. The gate 26, for each TFT, is formed by depositing a layer of doped, n+ for example, amorphous silicon directly over the substrate 30 and over the metal row conductor 14 and other row conductors 14 in the set to a thickness of between 5 nm and 10 nm. This layer is then patterned to leave portions covering respective metal row conductors 14 and providing the gate 26 in the form of an integral extension projecting outwardly from its associated row conductor. The gate 26 is then taper etched, for example using a dry etch process, such that the gate slopes outwardly at its edges towards the substrate. The angle made between the tapered edges of the gate and the substrate is between 10° and 30°. This facilitates good coverage of the overlying layers.

Figure 2B:
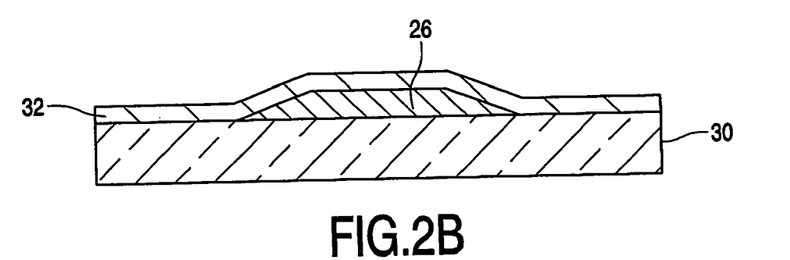

Following this, a gate insulating layer 32 of substantially uniform thickness is formed over the gate 26 as shown in FIG. 2B. This is done by depositing a thin insulating layer over the entire surface of the substrate to a thickness in the range of between 1 nm and 40 nm, and preferably between 1 nm and 5 nm. The smoothness of the doped amorphous silicon gate upper surface allows a relatively thin gate insulating layer to be used. The gate insulating layer may comprise silicon oxide, silicon nitride, tantalum oxide, aluminium oxide, titanium oxide, hafnium oxide, zirconium oxide or any other suitable material with a high dielectric constant. Alternatively, the gate insulating layer may comprise a pseudobinary alloy or a combination of more than one layer of any of these materials.

Figure 2C:
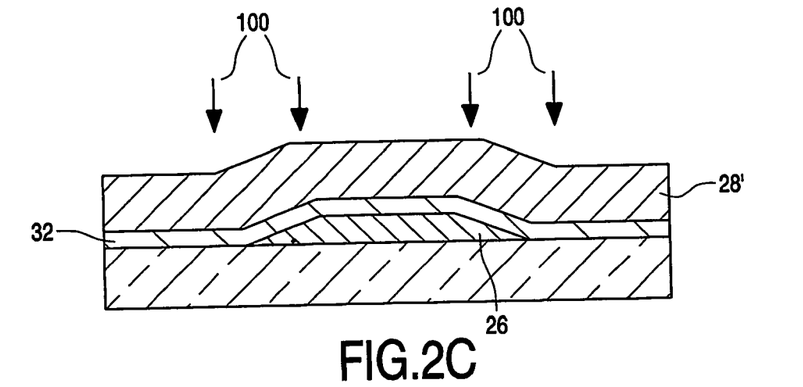

Thereafter, an intrinsic (undoped) amorphous silicon active layer 28' is formed over the gate insulating layer 32 and overlying at least part of the gate 26 by depositing the layer to a thickness of between 10 nm and 100 nm, preferably around 40 nm, over the substrate 30 as shown in FIG. 2C. Source and drain regions 22 and 24 for each TFT are then formed by doping respective regions of the amorphous silicon layer 28' by using a mask layer for example. The amorphous silicon active layer 28' is then annealed to form a polysilicon active layer 28. Such annealing of amorphous silicon to form polysilicon is well known and conventional methods in this respect can be used. Typically, energy beam 100 irradiates the surface of the amorphous silicon layer 28' so as to heat the layer throughout its entire thickness. The energy beam 100 comprises a pulsed laser beam of an ultra-violet wavelength generated by an excimer laser. A pulsed laser beam 100 of ultra-violet wavelength has the known advantage of permitting control of its absorption depth in the silicon layer 28' and also control of the melt depth of this layer when heated by the absorption of this pulsed laser energy. Useful laser wavelengths are 248 nm from a KrF laser, or a wavelength of 308 nm from a XeCl laser, or a wavelength of 351 nm from an XeF laser.

Figure 2D:
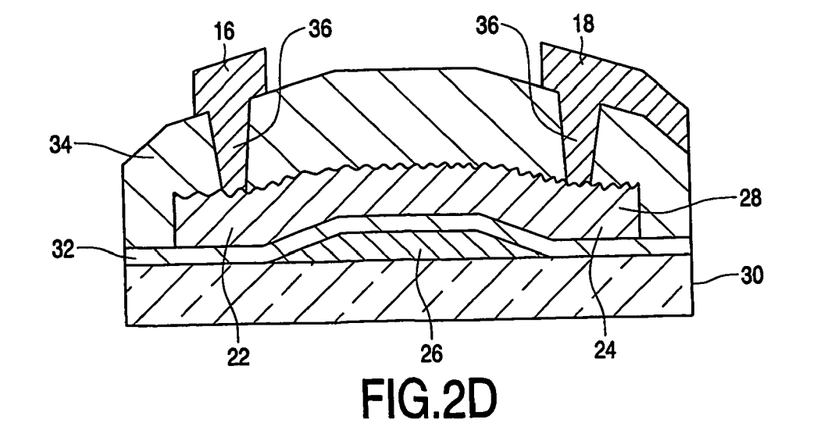

The doped amorphous silicon material of the gate 26 has a melting point similar to that of the amorphous silicon layer 28'. Therefore, the melt depth is chosen so that substantially the entire thickness of the amorphous silicon layer 28' is melted without melting the gate 26, and thus the risk of delamination. On cooling, the amorphous silicon layer 28' becomes polycrystalline, as denoted at 28 in FIG. 2D with its upper surface being roughened as typically is the case when amorphous silicon films are crystallised using a laser in this fashion. The polysilicon active layer 28 is then patterned to leave respective portions extending over the gates 26 at the locations of the TFTs constituting the active layer islands of the TFTs, as shown in FIG. 2D and FIG. 3, each having source and drain regions 22 and 24 at opposite sides of the gate.

Figure 4:
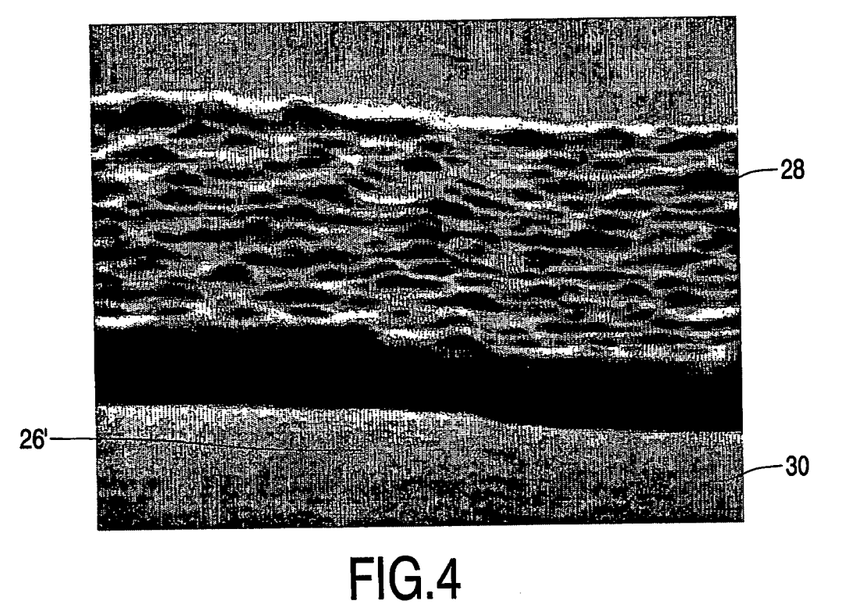
FIG. 4 shows a highly enlarged perspective Scanning Electron Microscopy (SEM) image of part the first embodiment of a device manufactured by a method in accordance with the present invention.

FIG. 4 shows a highly magnified perspective S.E.M image in part of the gate layer 26' on the substrate 30 and the patterned polysilicon layer 28 deposited and annealed using the method described above. It will be appreciated that S.E.M. images show only the surface topography. The dark stripe 42 is a side-on view of the patterned active island 28 and gives an indication of the relative thickness' of the layers. It can be seen that the gate layer 26' remains smooth even after being subjected to the conditions of the laser annealing process. The rough (top) surface of the polysilicon layer 28 can also be seen.

The annealing of the amorphous silicon layer 28' causes at least an upper surface region of the gate layer 26' to become microcrystalline by solid phase crystallisation through consequential heating of the gate layer. This, however, can be beneficial in improving the conductivity of the gate 26.

The smooth interface between the gate 26 and the gate insulating layer 32 ensured by the use of amorphous silicon for the gate layer enables thinner gate insulating layers of, say, a few nanometers in thickness, to be used, thus reducing the threshold voltage of the TFT.

A comparatively thick insulating layer 34 is then deposited over the entire substrate. This serves, inter alia, to separate the row conductors 14 from the column conductors 16 at their crossover points in the completed structure. Contact holes 36 are then formed in the insulating layer 34 down to the source and drain regions 22 and 24 of the polysilicon active islands 28 for each TFT 12. Following this, a metal film, for example aluminium, is deposited over the substrate and patterned to form both the set of metal column conductors 16 and the set of pixel electrodes 18. In the case of a reflective type AMLCD, the column conductors 16 and pixel electrodes 18 are formed of a reflective material such as aluminium., In the case of a transmissive type AMLCD, a transparent conducting material, such as ITO, is used. Each column conductor 16 contacts with the source regions 22 of the TFTs in the same column via the respective contact holes 36. Each pixel electrode 18 contacts with the drain region 24 of its respective TFT via its respective contact hole 36. This completes the fabrication of the TFTs of the active plate 10 for an active matrix device.

Figure 5:
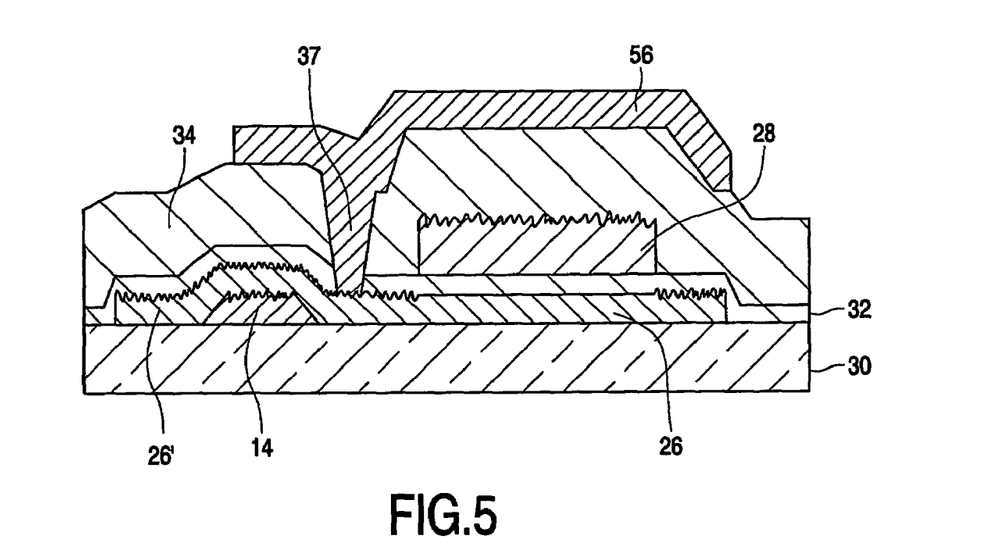
FIG. 5 shows a cross-section on the line III—III of FIG. 1 of a second embodiment of a device manufactured by a method in accordance with the present invention.

FIG. 5 shows a cross-section on the line III—III of FIG. 1 of a second embodiment of a device manufactured by a method in accordance with the present invention. The deposition and patterning of the gate layer 26', the gate insulating layer 32 and the amorphous silicon layer 28' is carried out in the same way as that for the first embodiment as described above. However, in this embodiment, the amorphous silicon layer 28' is patterned into islands before the annealing process.

Figure 6:
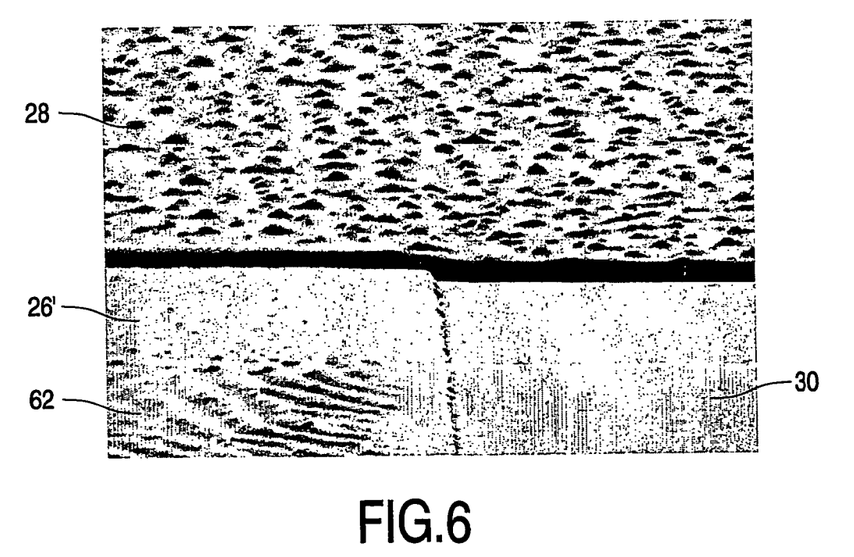
FIG. 6 shows a highly enlarged perspective SEM image of part the second embodiment of a device manufactured by a method in accordance with the present invention; and, FIG. 7 is a simplified schematic circuit diagram of an active matrix liquid crystal display device manufactured by a method in accordance with the present invention.

Referring to FIG. 5, the amorphous silicon layer 28' is patterned to leave respective portions constituting the active islands of the TFTs extending over a gate 26 at each of the locations of the TFTs. Following this, an energy beam corresponding to 100 in the first embodiment is directed towards the substrate. As in the first embodiment, the energy beam is preferably a laser beam. The gate material has a melting point similar to that of each of the amorphous silicon islands 28'. Therefore, the melt depth preferably is chosen so that substantially the entire thickness of each amorphous silicon island 28' is melted without melting the gate 26. As before, on cooling, the silicon island 28 becomes polycrystalline with the upper surface now roughened. However, the annealing process causes portions of the gate layer 26' not covered by the amorphous silicon active layer (islands) to become polycrystalline. Therefore, the top surfaces of the polysilicon islands 28 and the exposed areas of the gate layer are roughened by the laser annealing. The surface of the metal row conductors 14 may also deform due to the heating from the laser. As shown in FIG. 5, this has an insignificant effect on the functioning of these row conductors. FIG. 6 shows a highly magnified perspective S.E.M. image in part of the device in which the amorphous silicon layer 28' is patterned before the annealing process. As in FIG. 4 part of the gate layer 26' and the overlying polysilicon island 28 can be seen. However, the now exposed part of the gate layer 26' is partially polycrystalline and the roughened surface can be seen at 62. The gate 26 underlying the polysilicon island 28 (not visible in FIG. 6) remains amorphous, or at least partially microcrystalline, with a smooth surface.

Referring again to FIG. 5, then following the annealing process a comparatively thick insulating layer 34 is deposited over the entire substrate. This serves to separate the row conductors 14 from the column conductors 16 in the finished structure. As in the first embodiment, contact holes 36 are then formed in the insulating layer 34 down to the source and drain regions of the polysilicon active islands 28 for each TFT 12.

In addition to those formed in the first embodiment, a contact hole 37 is formed down to the gate layer 26' for each TFT which contacts with each respective gate 26. A conductive film, for example of aluminium or ITO, is then deposited and patterned to form the column conductors 16, the pixel electrodes 18 and a top-gate 56 for each TFT. The top-gate 56 overlies at least part of the polysilicon active layer 28 and the bottom-gate 26, with the insulating layer 34 serving as a gate insulating layer for this second gate.

The top-gate 56 can be formed from the same deposition layer as the column conductors 16 so that there are no extra deposition steps when compared to the first embodiment. The top-gate contacts with the bottom gate via the contact hole 37. This provides an active plate 10 having an array of dual-gated TFTs arranged in rows and columns. By including this extra gate in each TFT, the operational characteristics of the device are improved.

Although the gate layer 26' overlies the metal row conductors 14 in the two embodiments described above this is not essential. Instead the gate layer 26' may comprise the gates 26 which simply extend over and contact with the metal row conductors 14. Alternatively, the set of metal row conductors may be formed on top of the active plate after completion of the TFTs and insulated from the column conductors 16 and pixel electrodes 18, and contact with a plurality of gates 26 in their respective row via a further series of contact holes.

Figure 7:
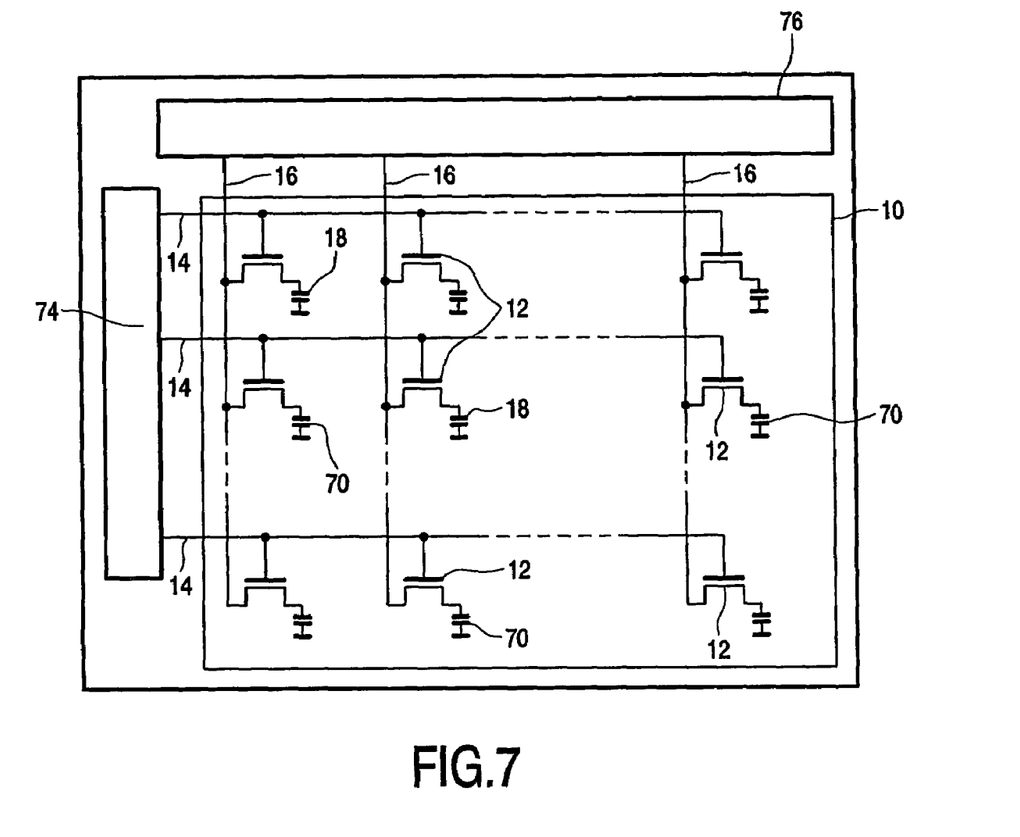

FIG. 7 is a simplified schematic circuit diagram of an active matrix liquid crystal display (AMLCD) device manufactured by a method in accordance with the present invention. The device comprises an active plate 10 manufactured according to the invention, and having an array of bottom-gate TFTs 12 arranged in rows and columns. The active plate also carries row and column conductors, 14 and 16, and pixel electrodes 18, each connected to an associated TFT 12. A layer of liquid crystal (LC) material is sandwiched between the active plate 10 and a passive plate 70 forming an array of display pixels corresponding to the array of TFTs. The pixel electrodes 18 are carried on the surface of the active plate adjacent the LC layer. The passive plate comprises an insulating substrate and carries on its inner surface adjacent the LC layer a transparent electrically conducting layer, for example ITO, which extends continuously over the display area, corresponding to the area of the array of LC cells 72, and serves as a common electrode for the display pixels.

Each pixel is addressed by row and column address circuitry, 74 and 76 respectively, via the row and column conductors 14' and 16. The address circuitry may be located remote from the active plate 10, as shown in FIG. 7, or integrated on the substrate 30, and formed by TFTs similar to those of the pixel array and fabricated at the same time.

Although the above embodiments are described in relation to AMLCDs, the invention is equally applicable to other active matrix display devices such as electroluminescent displays, electrophoretic displays and electro-chromic displays. The invention is applicable also to other kinds of active matrix array devices such as sensor array devices in which matrix sensing elements comprises, for example, optical sensing elements, as in image sensing array devices, or pressure or capacitive sensing elements, as in touch or fingerprint sensing array devices, and in which the matrix array of sensing elements are similarly addressed via TFTs and sets of row and column conductors.

From reading the present disclosure, other modifications will be apparent to persons skilled in the art. Such modifications may involve other features which are already known in the field of electronic devices comprising bottom-gate TFTs and component parts thereof and which may be used instead of or in addition to features already described herein.

What is claimed is:

1. A method of manufacturing an electronic device comprising a bottom-gate TFT, the method comprising the steps of:

forming a doped amorphous silicon gate layer on a substrate the gate layer defining a gate;

forming a gate insulating layer over the gate;

forming an amorphous silicon active layer over the gate insulating layer and overlying at least part of the gate; and annealing the amorphous silicon active layer to form a polysilicon active layer wherein the annealing causes a portion of the gate layer not covered by the amorphous silicon active layer to become polycrystalline.

2. A method according to claim 1 wherein the gate layer thickness is between 5 nm and 10 nm.

3. A method according to claim 1, wherein the ate is tapered such that the edge of the gate slope outwardly towards the substrate.

4. A method according to claim 3, wherein the angle made between at least one tapered edge of the gate and the substrate is between 10° and 30°.

5. A method according to claim 1, wherein the gate insulating layer thickness is between 1 nm and 40 nm.

6. A method according to claim 1, wherein the gate insulating layer thickness is between 1 nm and 5 nm.

7. A method according to claim 1, wherein the amorphous silicon active layer thickness is between 10 nm and 100 nm.

8. A method according to claim 7, wherein the method further comprises the steps of;
   forming a top-gate overlying at least part of the polysilicon active layer.

9. A method according to claim 8, wherein the electronic device comprises an active plate for an active matrix device, the active plate comprising an array of TFTs arranged in rows and columns.

10. A method according to claim 9, wherein the method further comprises the step of:
    forming a set of row conductors, each row conductor contacting with a plurality of gates in the same row.

11. A method according to claim 10, wherein the electronic device comprises an active matrix display device.

12. A method of manufacturing an electronic device comprising a bottom-gate TFT, the method comprising the steps of:
    forming a doped amorphous silicon gate layer sat a substrate, the gate layer defining a plurality of gates with tapered edges, and an upper surface region. a first portion and a second portion;
    forming a gate insulating layer over the first portion of each gate;
    forming an amorphous silicon active layer over the first portion of the gate. insulating layer and overlying at least part of each gate; and
    annealing the amorphous silicon active layer to cause at least the upper surface region of the gate layer to become microcrystalline, and to cause the second portion not covered by the amorphous silicon active layer to become polycrystalline.

13. A method according to claim 12, wherein the tapered edges of gates taper at an angle of between 10° and 30° with respect to the substrate.

14. A method according to claim 13, wherein the gate insulating layer has a thickness of between 1 nm and 5 nm, and the amorphous silicon active layer has a thickness is between 10 nm and 100 nm.

15. A method according to claim 14, wherein the method further comprises the step of:
    forming a set of row conductors, each row conductor contacting the pularity of gates in the same row.

* * * * *